(12) United States Patent
Lee et al.

(10) Patent No.: US 6,942,931 B2
(45) Date of Patent: Sep. 13, 2005

(54) WHITE ELECTROLUMINESCENT POLYMER AND ORGANIC ELECTROLUMINESCENT DEVICE USING THE SAME

(75) Inventors: Ji Hoon Lee, Daejun-Shi (KR); In Nam Kang, Daejun-Shi (KR)

(73) Assignee: Samsung SDI Co., Ltd., Kyungki-do (KR)

( * ) Notice: Subject to any disclaimer, the term of this patent is extended or adjusted under 35 U.S.C. 154(b) by 0 days.

(21) Appl. No.: 10/170,208

(22) Filed: Jun. 13, 2002

(65) Prior Publication Data

US 2003/0008175 A1 Jan. 9, 2003

(30) Foreign Application Priority Data

Jun. 13, 2001 (KR) ......................................... 2001-33140

(51) Int. Cl.[7] ........................ H05B 33/14; C09K 11/06; C08G 61/12
(52) U.S. Cl. ....................... 428/690; 428/917; 313/504; 313/506; 257/40; 252/301.35; 526/259; 528/423
(58) Field of Search ................................ 428/690, 917; 313/504, 506; 257/40; 252/301.35; 526/259; 528/423

(56) References Cited

U.S. PATENT DOCUMENTS 6,630,254 B2 * 10/2003 Leclerc et al. .............. 428/690
2002/0177687 A1 * 11/2002 Noguchi et al. ............ 528/498

FOREIGN PATENT DOCUMENTS

JP          8-003547       1/1996

OTHER PUBLICATIONS

Liu et al., "Blue–Light–Emitting Fluorene–Based Polymers with Tunable Electronic Properties", Chem. Mater. 2001, 13, pp. 1984–1991 (published on Web Jun. 2, 2001).*

Morin et al., "Syntheses of Conjugated Polymers Derived from N–alkyl–2, 7–carbazoles", Macromolecules 2001, 34, pp. 4680–4682 (published on Web Jun. 6, 2001).*

Xia et al., "Decreased Aggregation Phenomena in Polyfluorenes by Introducing Carbazole Copolymer Units", Macromolecules 2001, 34, pp. 5854–5859 (published on Web Jun. 27, 2001).*

* cited by examiner

Primary Examiner—Marie Yamnitzky
(74) Attorney, Agent, or Firm—Lee & Morse, P.C.

(57) ABSTRACT

A white electroluminescent polymer having a 3,3'-bicarbazyl group incorporated into a polymeric main chain of polyarylene, represented by the Formula 1:

Formula 1

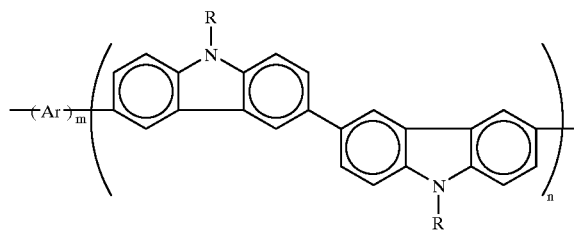

in which Ar is an aromatic group having 6 to 26 carbon atoms, or a heteroaromatic group having 4 to 14 carbon, in which the aromatic group may be substituted with alkyl group, alkoxy group or amine group, each having 1 to 12 carbon atoms; R is a hydrogen atom, linear, branched or cyclic alkyl group having 1 to 12 carbon atoms, or an aromatic group having 6 to 14 carbon atoms, in which the aromatic group may be substituted with alkyl group, alkoxy group or amine group, each having 1 to 12 carbon atoms; and m and n may be the same or different, and satisfy the following relationships $0.1 \leq m/(m+n) \leq 0.9$ and $0.1 \leq n/(m+n) \leq 0.9$. The present inventive white electroluminescent polymer is capable of overcoming the limits of conventional polymer blending systems.

8 Claims, 10 Drawing Sheets

WHITE ELECTROLUMINESCENT POLYMER AND ORGANIC ELECTROLUMINESCENT DEVICE USING THE SAME

BACKGROUND OF THE INVENTION

1. Field of the Invention

The present invention relates to a white electroluminescent polymer and an organic electroluminescent device using the same. More particularly, the present invention relates to a white electroluminescent polymer including a 3,3'-bicarbazyl group incorporated into the main chain of the polymer, and an organic electroluminescent device using the same.

2. Description of Related Art

Electroluminescence phenomenon using organic materials was initially reported by Pope et al. in 1963. Tang et al. reported in 1987 a brightness and high-efficiency electroluminescent device emitting green light formed using tris(8-quinolinolato)aluminum ($Alq_3$), a pigment having a $\pi$-conjugated structure, and that has a multi-layered structure, quantum efficiency of 1% at 10 V or less, and a brightness of 1000 $cd/m^2$. Since then, much research and studies have been actively conducted on $Alq_3$ all over the world.

On the other hand, low-molecular weight materials are particularly advantageous over polymers for use as electroluminescent materials because they can be prepared via simple synthesis routes. In addition, these low molecular weight materials can be used to synthesize various luminescent materials capable of emitting light of the three primary colors, (i.e., red, green and blue lights,) in the visible light region through a proper design of molecules. Today, the level of electroluminescence (EL) display technology using low molecular weight materials has achieved, in the case of passive matrix type full color displays, sizes of 10", and, in the case of active matrix type displays employing a thin film transistor technique, about 15.1" (Samsung SDI Co., Ltd., Republic of Korea).

However, there are two major obstacles that need to be overcome: (i) luminescence efficiency; and (ii) lifetime of electroluminescent devices. In the case of monochromatic devices, a long lifetime can be achieved to some degree. For example, the lifetime of a blue-emitting device is about 20,000 hrs (Idemitsu Kosan, Japan), a green-emitting device 50,000 hrs (Eastman Kodak, U.S.A.) and a red-emitting device 20,000 hrs (Eastman Kodak, U.S.A.), respectively. However, in practice, the blue- and red-emitting devices still need to be improved in terms of luminescence efficiency, and problems still need to be solved when using them in full color devices. With respect to the luminescence efficiency, luminescence properties of a high efficiency and a high brightness can be expected only when using a multilayered system that includes a buffer layer, a hole transporting layer (HTL), an electron transporting layer (ETL), and a hole blocking layer (HBL).

High molecular weight materials, polymers usually have a drive voltage of 2 to 3 V less than low molecular weight materials. They also are advantageous because they can be used on a flexible substrate by applying them to the substrate using spin coating or roll coating techniques. Furthermore, in respect of performance, the high molecular weight materials do not fall behind the low molecular weight materials. However, there still are some defects (e.g., they fail to achieve particular results) when the high molecular weight materials are applied to the full color method, except for ink jet printing, and that they are difficult to adapt to a mass production system. Moreover, one of the primary defects of these high molecular weight materials is that blue light emitting materials with a long lifetime and a high color purity are not achieved.

In many ways white electroluminescent devices having high luminescence efficiency are important subjects of research and intensive studies in the development of automotive dome lights or full color displays combining backlight and color filter in Liquid Crystal Displays (LCDs). Particularly, a combination of the white light and the color filter in polymer LED is considered to have great potential for application in the full color display. In general, methods for inducing white luminescence are roughly divided into two categories. The first method is to dope a host material used in the emitting layer with guest materials (luminescent dyes). In this system, luminescence occurs when energy is transferred from the host material having a large energy band gap to the dopant having a relatively small energy band gap, or when some carriers are trapped in the dopant site. In the former case, since an incomplete energy transfer takes place, separate luminescence of the host material and the dopant can be observed. For multilayered devices based on low molecular weight materials, at least 3 to 4 layers typically are used to produce white luminescence. On the other hand, for multilayered devices based on polymeric materials, two types of polymeric materials can be used that are respectively doped with pigments having low molecular weights or blended with another polymeric material having a wavelength longer than that of the matrix in a proper proportion. However, it is not easy to find the optimal conditions for such blending or doping. In particular, one of the most serious problems is deterioration of the device performance such as color purity and durability due to phase separation, which can be caused by driving of the device for a long time. With respect to the white electroluminescence, color purity is one of the most important requirements to be fulfilled and moreover, stability of color purity is considered to be the most important above all other things. Therefore, it also is imperative to attain a polymeric system having morphological stability so as not to undergo the phase separation.

The second method is only applicable to the multilayered devices based on low molecular weight materials. As claimed in this method, a new layer blocking certain carriers, i.e., holes or electrons, is disposed between the hole transporting layer and electron transporting layer as an exciton recombination zone, whereby the hole transporting layer and the electron transporting layer separately emit their respective lights. In this case, the concentration of the dopant used, and the thickness of respective layers should be properly adjusted so that pure white luminescence can be obtained.

Generally, in electroluminescent devices using organic materials, the driving voltage of fabricated devices depends in part on the ease of hole injection from an anode into an emitting layer, and the luminescence efficiency depends in part on the effectiveness of electron injection from a cathode into an emitting layer. The hole injection into the luminescence layer is readily performed, and thus relatively easy, whereas the electron injection into the luminescence layer is relatively difficult. Furthermore, the hole mobility is several tens of times higher than the electron mobility. Thus, a major charge carrier in electroluminescent devices is holes. A luminescence mechanism of normal electroluminescent devices involves holes injected from an anode, and electrons injected from a cathode. The holes and electrons are recombined in an emitting layer to form singlet excitons. The excitons then radioactively decay, upon which light having a wavelength corresponding to a band gap of the used luminescent materials is emitted. At this point, luminescence efficiency also is determined. When the amounts of the injected holes and electrons are balanced, the optimal luminescence efficiency is obtained. Thus, the mobility and density of the holes and electrons should be balanced so that these two carriers can be transported at a similar rate to each other.

However, in general, since the holes are transported more favorably and easily, disproportion in transport rates between the carriers can occur, which in turn causes a reduction in the luminescence efficiency. Therefore, for the purpose of offsetting the above imbalance, luminescent devices typically are formed in a multilayered fashion to have an electron transport layer having high electron mobility.

Carbazole has been widely used as a photoconductive, photovoltaic, photorefractive and electroactive material due to its strong fluorescent intensity and high hole transporting capability. In particular, poly(N-vinylcarbazole) (PVK), in which a carbazole molecule is incorporated as a side chain, still is used as a hole transport material in the organic electroluminescence field. Such a dimeric carbazole has an improved thermal stability and electrochemical stability, when compared to monomeric carbazole derivatives. In addition, the dimeric carbazole exhibits low oxidation potential by extension of conjugation and thus is expected to be useful as a material for hole transport layers or luminescence layers.

The description herein of certain disadvantages of known devices, systems, methods, and apparatus, is not intended to limit the scope of the present invention to devices, systems, methods, and apparatus that do not include these materials. Indeed, certain embodiments of the present invention may employ the known devices, systems, methods, and apparatus, without suffering from their previously known disadvantages.

SUMMARY OF THE INVENTION

A feature of an embodiment of the present invention is to provide a novel electroluminescent polymer capable of providing high electroluminescence efficiency and thermal and electrical stability. Another feature of an embodiment of the present invention is to provide an electroluminescent device using the above electroluminescent polymer.

In accordance with these and other features of various embodiments of the invention, there is provided a white electroluminescent polymer having a 3,3'-bicarbazyl group incorporated into a polymeric main chain of polyarylene represented by the following Formula 1:

Formula 1 in which Ar is an aromatic group having 6 to 26 carbon atoms, or a heteroaromatic group having 4 to 14 carbon atoms, in which the aromatic group may be substituted with alkyl group, alkoxy group or amine group having 1 to 12 carbon atoms;

R is a hydrogen atom, linear, branched or cyclic alkyl group having 1 to 12 carbon atoms, or an aromatic group having 6 to 14 carbon atoms, in which the aromatic group may be substituted with alkyl group, alkoxy group or amine group having 1 to 12 carbon atoms; and m and n may be the same or different, and satisfy the following relationships m+n=1.0, m/(m+n) is from 0.1 to 0.9, inclusive, and n/(m+n) is from 0.1 to 0.9. inclusive.

As claimed in another feature of an embodiment of the present invention, there is provided an organic electroluminescent device comprising an electroluminescent layer that comprises the above white electroluminescent polymer of formula 1.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF THE INVENTION

Priority Korean Patent Application No. 2001-33140 filed Jun. 13, 2001, and entitled "White Electroluminescent Polymer and Organic Electroluminescent Device Using the Same," is incorporated herein in its entirety by reference.

The present invention is directed to a white electroluminescent polymer in which a 3,3"-bicarbazyl group of a dimeric structure having useful properties is incorporated into a polymeric main chain of polyarylene represented by the following Formula 1:

Formula 1 in which Ar is an aromatic group having 6 to 26 carbon atoms, or a heteroaromatic group having 4 to 14 carbon atoms, in which the aromatic group may be substituted with alkyl group, alkoxy group or amine group having 1 to 12 carbon atoms;

R is a hydrogen atom, linear, branched or cyclic alkyl group having 1 to 12 carbon atoms, or an aromatic group having 6 to 14 carbon atoms, in which the aromatic group may be substituted with alkyl group, alkoxy group or amine group having 1 to 12 carbon atoms; and m and n may be the same or different, and satisfy the following relationships m+n=1.0, m/(m+n) is from 0.1 to 0.9, inclusive, and u/(m+n) is from 0.1 to 0.9, inclusive.

By incorporating the 3,3'-bicarbazyl group into the main chain of a luminescent polymer, it has become possible to control the hole transporting property, HOMO/LUMO energy level, thermal stability, and emission wavelength by varying the portion of 3,3'-bicarbazyl group in the polymer. Specifically, it is possible to induce additional luminescence in the green region using excimer or exciplex, which then combines with the blue luminescence emitted from the main chain of the luminescent polymer itself to finally induce white luminescence. In addition, as claimed in the present invention, CIE 1931 color coordinates of the emitted light can be controlled as claimed in types and proportions of the monomers and R group.

The 3,3'-bicarbazyl group preferably is substituted at N and N' positions thereof to improve solubility as well as electrical and thermal properties of the luminescent polymer. Preferred examples for the arylene structure contained in the main chain of the white luminescent polymer as claimed in the present invention include arylenic structures represented by the following groups depicted in Formula 2 or 3. Most preferably, the arylenic structure is an alkylfluorene.

Formula 2 in which $R_1$ and $R_2$ are independently an alkyl or an alkoxy group having 1 to 12 carbon atoms.

Formula 3

-continued in which $R_1$ and $R_2$ are independently an alkyl group having 1 to 12 carbon atoms.

Figure 1:
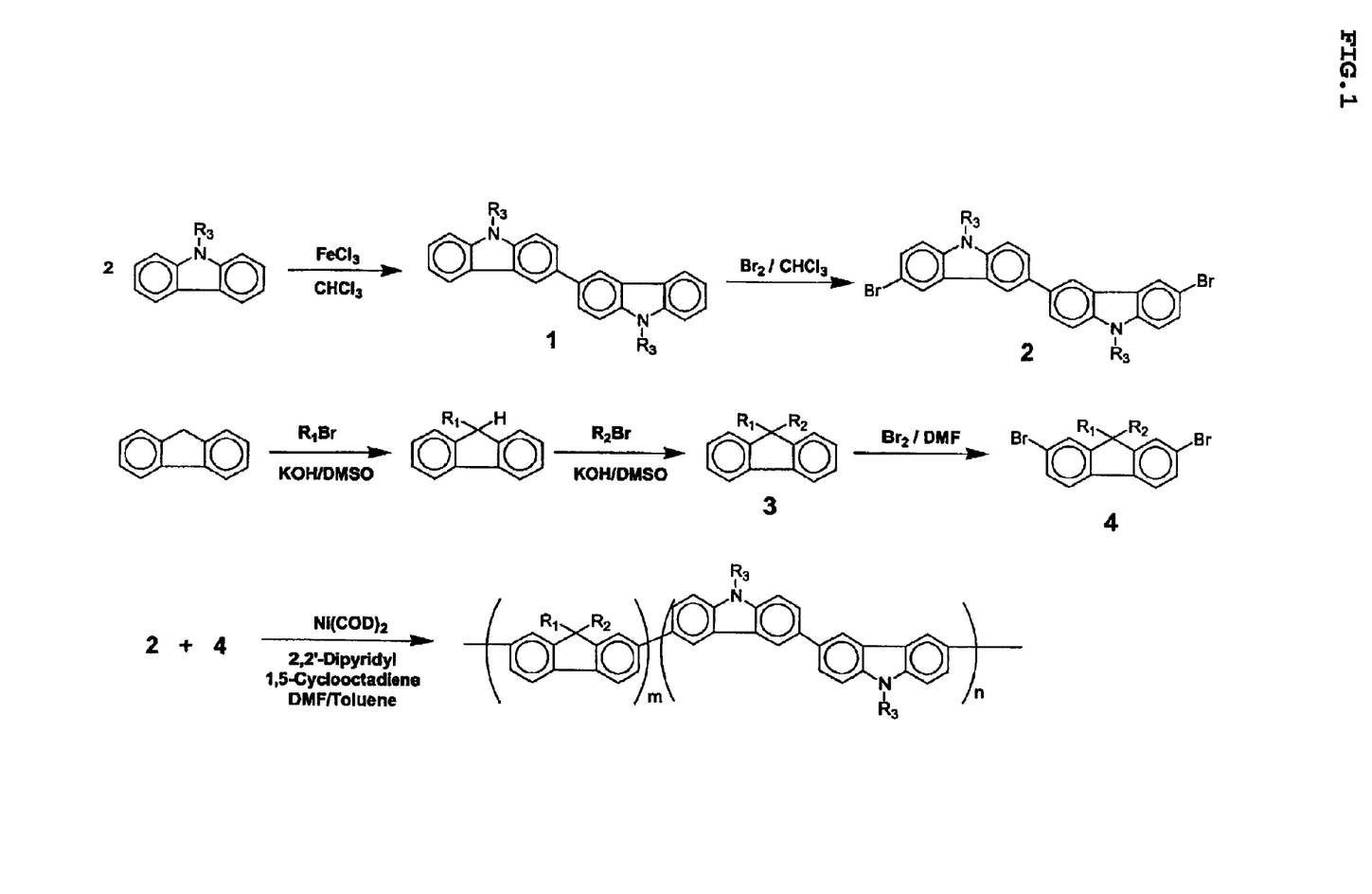
FIG. 1 is a schematic view showing the reaction sequence of the process for preparing the white electroluminescent polymer as claimed in the present invention.

In FIG. 1, there is shown a schematic view illustrating a method for preparing the electroluminescent polymer as claimed in a preferred embodiment of the present invention, in which alkylfluorene is used as the arylene structure of the polymeric main chain.

Firstly, N-alkyl carbazol or N-aromatic carbazol is formed into a dimer by an oxidizing agent. The dimeric carbazol may be substituted at positions 3 and 6 with a Br atom, respectively, from molecular bromine to produce the compound represented by numeral 2 in FIG. 1. The respective foregoing procedures are performed quantitatively. A fluorene-based monomer is synthesized as follows. Alkyl groups are introduced at once or sequentially into the position 9 of fluorene. Then two Br atoms from molecular bromine are introduced to produce a dibromofluorene monomer represented by numeral 4 in FIG. 1. Two monomers (e.g., those represented by numerals 2 and 4) obtained by the above methods then can be copolymerized to produce the white electroluminescent polymer as claimed in the present invention. Skilled artisans will appreciate that the reaction schemes depicted in FIG. 1 are exemplary only, and that numerous modifications may be made thereto to form the polymer of the present invention. Using the guidelines provided herein, those skilled in the art are capable of making electroluminescent polymers of Formula 1 without undue experimentation.

The white electroluminescent polymer of the present invention preferably has a weight average molecular weight (Mw) of about 3,000 to 200,000. Preferably, the distribution of the molecular weight (Mw/Mn) is from about 1.5 to about 5.

As claimed in another aspect of the present invention, the invention is directed to an organic electroluminescent device with an electroluminescent layer that includes the white electroluminescent polymer described previously. The organic electroluminescent devices may have a structure of anode/hole transporting layer/emitting layer/cathode, anode/buffer layer/hole transporting layer/emitting layer/cathode, anode/buffer layer/hole transporting layer/emitting layer/electron transporting layer/cathode, or anode/buffer layer/hole transporting layer/emitting layer/hole blocking layer/cathode. The structure of the electroluminescent device is not limited in the present invention, and any particular arrangement can be used. Those skilled in the art are capable of fabricating an electroluminescent device including the polymer of the present invention, using the guidelines provided herein.

The buffer layer preferably comprises CuPc (copper phthalocyanine), polythiophene, polyaniline, polyacetylene, polypyrrole or polyphenylene vinylene derivatives. The hole blocking layer may be formed of LiF or $MgF_2$.

The present invention now will be described in detail with reference to following examples. These examples, however, are intended to illustrate the present invention and should not be construed as limiting the scope of the present invention.

EXAMPLE 1

Synthesis of N,N'-diethyl-3,3'-bicarbazyl

N-ethylcarbazole (20 g (99.35 mmol)) was placed into a 250 ml Schlenk flask and 150 ml of chloroform was added to dissolve the N-ethylcarbazole. Separately, 64.46 g (0.397 mol, 4.0 eq) of $FeCl_3$ was dispersed into 100 ml of chloroform. The dispersion was added to the flask dropwise. At this point, the solution in the flask gradually turned to a dark green color due to the formation of carbazole cation radicals. After 24 hours, the reaction mixture was poured into excess methanol. The precipitated solid was isolated by filtration and continuously washed with excess methanol, and three times with water. After drying, the N,N'-diethyl-3,3'-bicarbazyl was obtained at 95% yield. Its structure was confirmed by $^1$H-NMR. $^1$H-NMR (300 MHz, $CDCl_3$): d 1.50 (t, 6H, 2-$CH_3$), 4.45 (quartet, 4H, 2-$NCH_2$), 7.26–8.5 (m, 14H, aromatic protons).

EXAMPLE 2

Synthesis of N,N'-diethyl-6,6'-dibromo-3,3'-bicarbazyl

Figure 3:
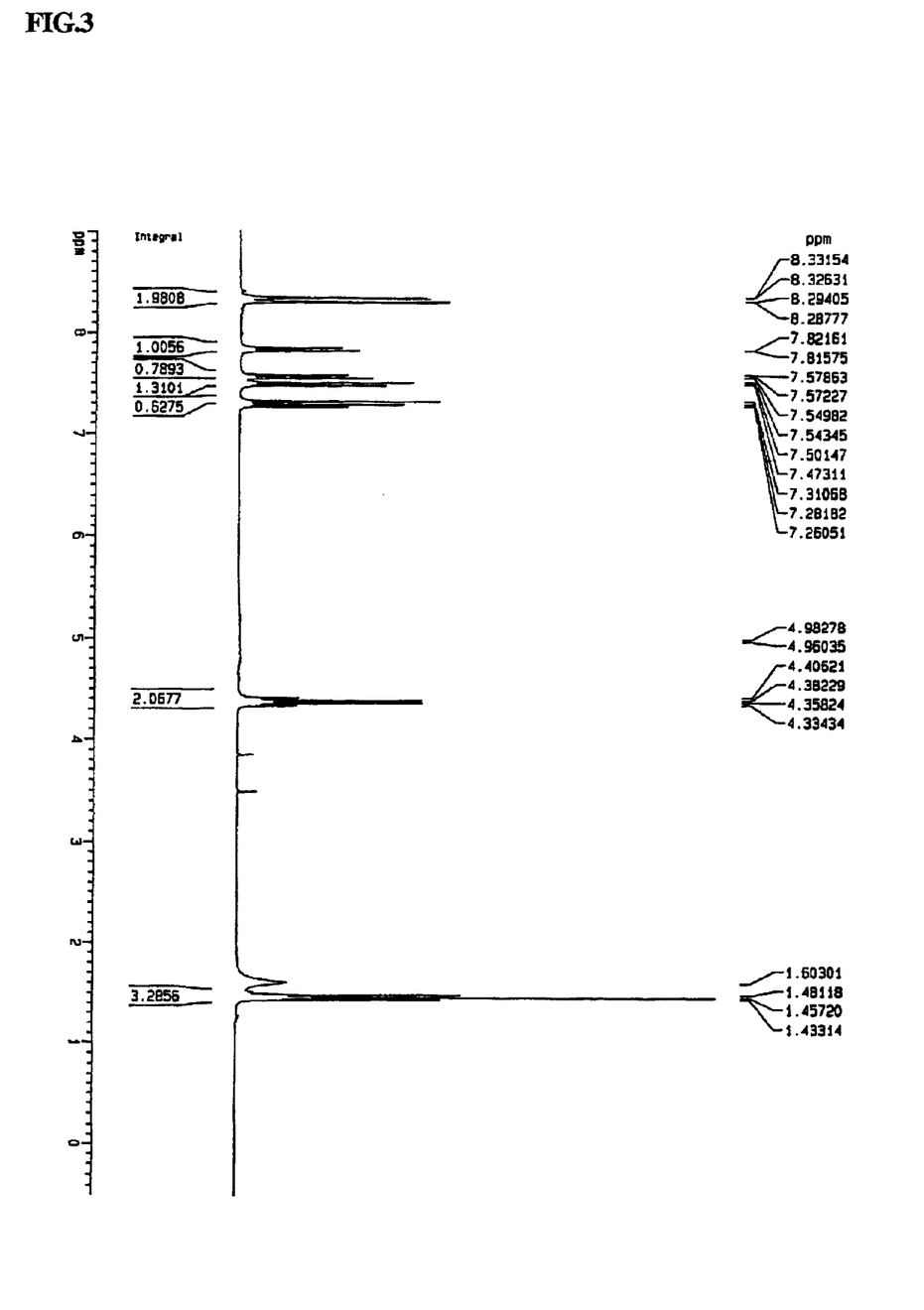
FIG. 3 is a view showing a $^1$H-NMR spectrum of N,N'-diethyl-6,6'-dibromo-3,3'-bicarbazyl prepared in Example 2 as claimed in the present invention.
Figure 4:
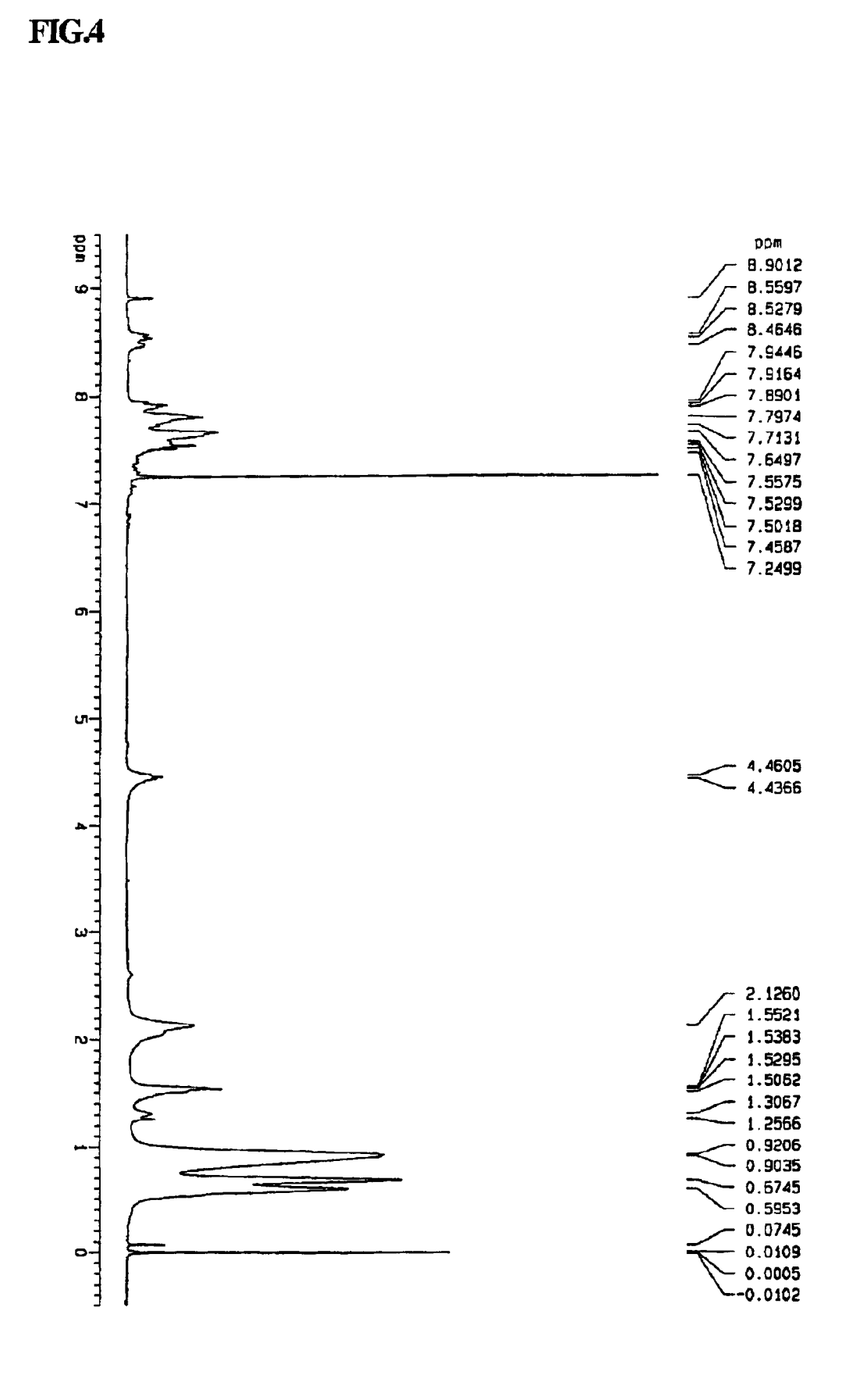
FIG. 4 is a view showing a $^1$H-NMR spectrum of the white electroluminescent polymer prepared in Example 8 as claimed in the present invention.
Figure 5:
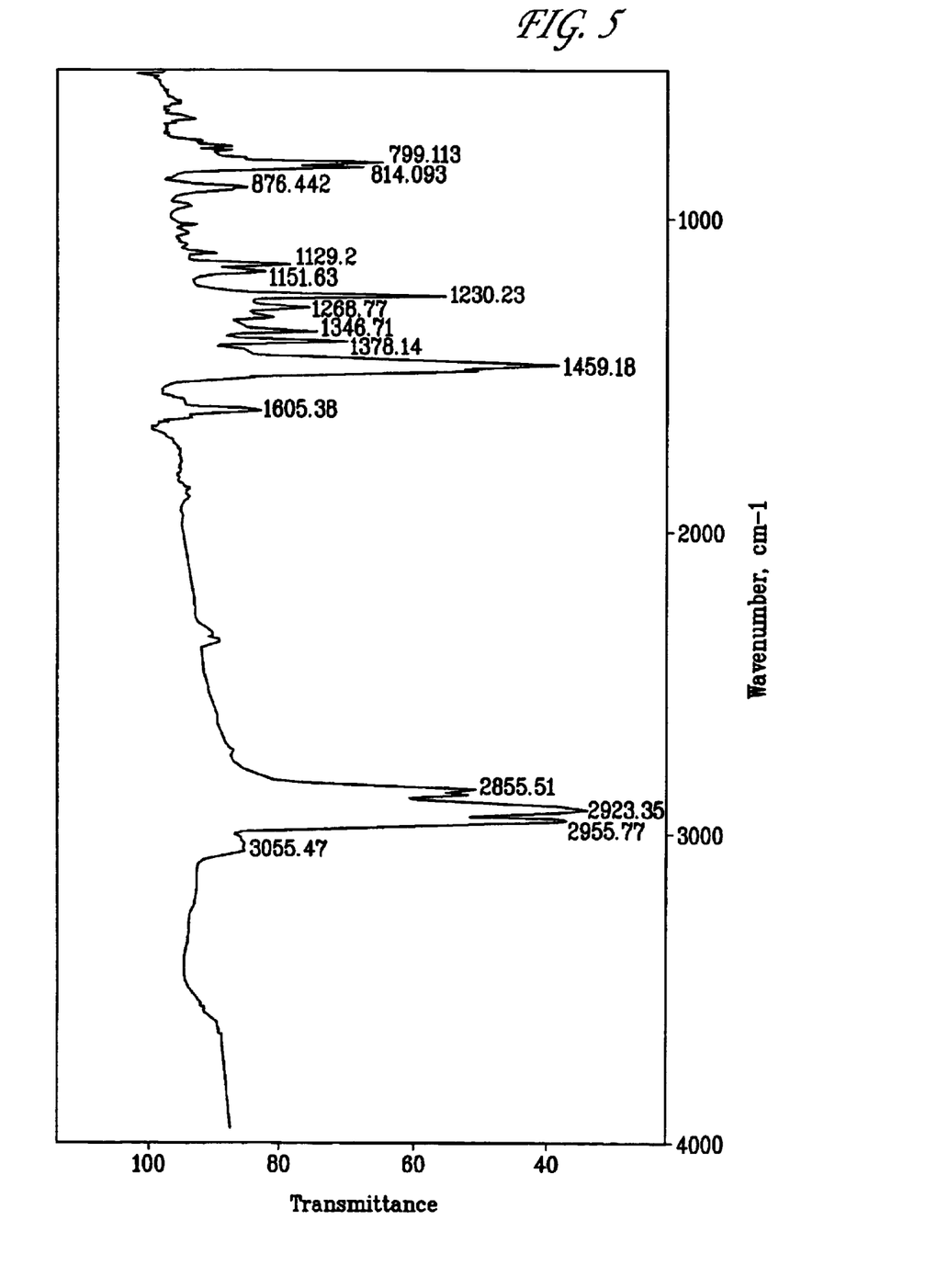
FIG. 5 is a view showing a FT-IR spectrum of the white electroluminescent polymer prepared in Example 9 as claimed in the present invention.

N,N'-diethyl-3,3'-bicarbazyl (4 g (10 mmol)) was placed into a 100 ml Schlenk flask, and 50 ml of chloroform was added to dissolve the contents. Separately, 5.0 g (31 mmol, 3.0 eq) of bromine was dissolved in 10 ml of chloroform. The resulting solution was added to the flask dropwise. For this procedure, the temperature of the reaction was maintained at about 0° C. using an ice bath. The solution in the flask gradually turned to dark green color. After 30 to 40 minutes, the reaction mixture was poured into excess water and washed repeatedly with 1.0 N NaOH(aq). The separated chloroform layer was again poured into methanol. The precipitated solids were isolated by filtration and washed repeatedly with excess methanol and water. After drying, the N,N'-diethyl-6,6'-dibromo-3,3'-bicarbazyl was obtained at 90% yield. Its structure was confirmed by $^1$H-NMR as shown in FIG. 3. $^1$H-NMR (300 MHz, $CDCl_3$): d 1.46 (t, 6H, 2-$CH_3$), 4.34 (quartet, 4H, 2-$NCH_2$), 7.26–8.33 (m, 12H, aromatic protons).

EXAMPLE 3

Synthesis of N-(3-methylphenyl)carbazole

Activated Cu, (4.2 g (65.8 mmol, 1.1 eq)), 12.4 g (89.7 mmol, 1.5 eq) of $K_2CO_3$, 10 g (59.8 mmol) of carbazole, 0.47 g (3 mol %) of 18-crown-6 and 13.7 g (62.8 mmol, 1.05 eq) of 3-iodotoluene were added into 100 ml of dried 1,2-dichlorobenzene and reacted at 180° C. for 24 hours. Then, the reaction mixture was filtered to remove un-reacted Cu and salts. The filtrate was distilled under reduced pressure to remove the solvent and purified by silica gel chromatography. The product was obtained as a colorless liquid at 88.3% (15.5 g) yield. $^1$H-NMR (300 MHz, $CDCl_3$): δ 8.17 (2H, d), 7.51–7.27 (10H, m), 2.51 (3H, s).

EXAMPLE 4

Synthesis of N,N'-di(3-methylphenyl)-3,3'-bicarbazyl

N-(3-methylphenyl)-carbazol (15 g (51 mmol)) was added to 200 ml of $CHCl_3$ in a 500 ml flask. A previously prepared slurry of dried $FeCl_3$ (33 g, 4 eq)/$CHCl_3$ was added slowly to the solution in the flask and reacted for 6 hours at room temperature. Then, the reaction was filtered to remove solids. The filtrate was concentrated and added to methanol to form precipitates. The precipitates were washed several times. The product was obtained as a pale yellow solid at 87% (20 g) yield. $^1$H-NMR (300 MHz, CDCl$_3$): δ 8.50 (2H, m), 8.27 (2H, d), 7.81 (2H, d), 7.55–7.28 (16H, m), 2.53 (6H, s).

EXAMPLE 5

Synthesis of N,N'-di(3-methylphenyl)-6,6'-diiodo-3, 3'-bicarbazyl

N,N'-di(3-methylphenyl)-3,3'-bicarbazyl (5 g (85.4 mmol)) was added to 300 ml of acetic acid in a 500 ml flask. KI (2.98 g (2.1 eq)), and 3.84 g (2.1 eq) of KIO$_3$ were added thereto. The reaction mixture was heated to 80° C. The completion of the reaction was determined by TLC. The reaction mixture was extracted with a solution of CHCl$_3$/NaOH(aq). The organic layer was dried and concentrated. The residue was added to methanol to form precipitates, which were washed several times. The product was obtained as a pale yellow solid at 80% (57 g) yield. $^1$H-NMR (300 MHz, CDCl$_3$): δ 8.56 (2H, s),8.39 (2H, s), 7.80 (2H, d), 7.77 (2H, d) 7.55–7.21 (12H, m), 2.51 (6H, s).

EXAMPLE 6

Synthesis of 9,9'-di(2-ethylhexyl)-2,7-dibromofluorene

Approximately 25 g (77 mmol) of 2,7-dibromofluorene and 36 g (185 mmol) of 2-ethylhexyl bromide were dissolved in 100 ml of toluene, followed by addition of 1.25 g (385 mmol) of TBAB (tetrabutyl ammonium bromide). NaOH (31 g (770 mmol)) dissolved in 50 ml of water, was added thereto and refluxed for 2 days. After completion of the reaction, the reaction mixture was extracted with water and CHCl$_3$. The organic layer was dried with MgSO$_4$, concentrated, and passed through a silica gel column (hexane). The eluate was distilled to remove unreacted 2-ethylhexyl bromide. Approximately 36 g of the product was obtained at 85% yield. $^1$H-NMR (300 MHz, CDCl$_3$): δ 0.54 (m, 12H), 0.60–1.02 (m, 18H), 1.94 (d, 4H), 7.49 (m, 6H).

EXAMPLE 7

Synthesis of 9,9'-dioctyl-2,7-dibromofluorene

Figure 2:
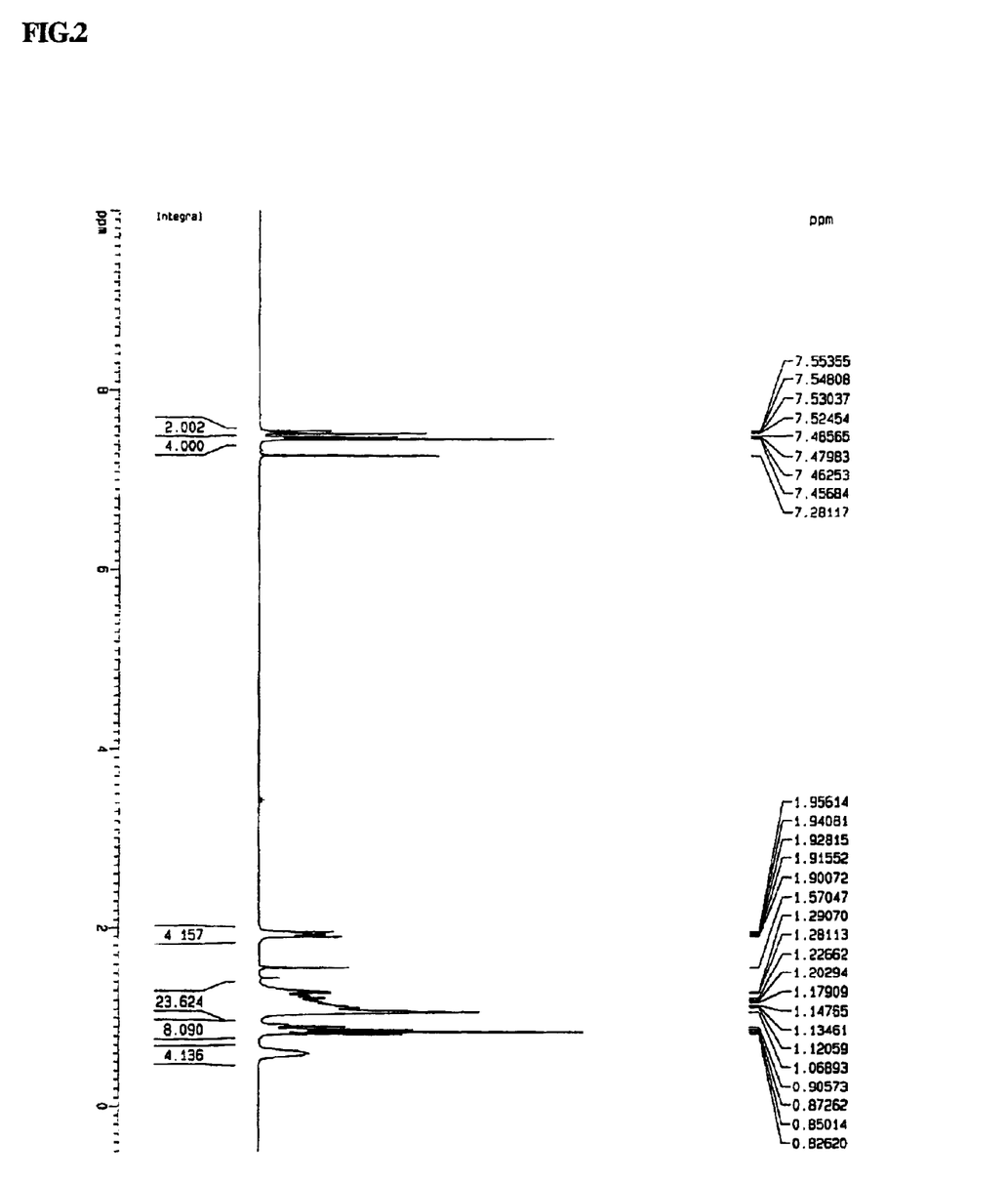
FIG. 2 is a view showing a $^1$H-NMR spectrum of 9,9'-di (n-octyl)-2,7-dibromofluorene prepared in Example 7 as claimed in the present invention.

About 25 g (77 mmol) of 2,7-dibromofluorene and 36 g (185 mmol) of n-octyl bromide were dissolved in 100 ml of toluene, followed by addition of 1.25 g (385 mmol) of TBAB. Approximately 31 g (770 mmol) of NaOH dissolved in 50 ml of water was added thereto and refluxed for 2 days. After completion of the reaction, the reaction mixture was extracted with water and CHCl$_3$. The combined organic layer was dried with MgSO$_4$, concentrated, and passed through a silica gel column (hexane). The eluate was distilled to remove un-reacted n-octyl bromide. About 40 g of the product was obtained at 95% yield. Its structure was confirmed by $^1$H-NMR as shown in FIG. 2. $^1$H-NMR (300 MHz, CDCl$_3$): δ 0.65 (broad s, 4H), 0.87 (m, 6H), 1.21 (m, 20H), 1.93 (m, 4H), 7.48 (m, 4), 7.54 (m, 2H).

EXAMPLE 8

Synthesis of poly[9,9'-di(2etylhexyl)-2,7-fluorenyl-co-6,6'-N,N'-diethyl-3,3'-bicarbazyl] (3:1 feed ratio)

As a monomer solution, 0.374 g (0.683 mmol) of 9,9'-di (2-ethylhexyl)-2,7-dibromofluorene and 0.125 g (0.228 mmol) of N,N'-diethyl-6,6'-dibromo-3,3'-bicarbazyl were added to 5 ml of toluene, which had been degassed with nitrogen, in a 50 ml Schlenk flask and stored under nitrogen atmosphere. Ni(COD)$_2$, (0.44 g (1.7 eq)), about 0.17 g (1.7 eq) of 1,4-cyclooctadiene (COD), and 0.25 g (1.7 eq) of bipyridyl as catalysts were added to another 50 ml Schlenk flask as a reactor. Then, 5 ml of toluene, which had been degassed with nitrogen, and 5 ml of DMF were added thereto, followed by stirring at 80° C. for 30 minutes. The above-prepared monomer solution was added to the reactor after washing with 5 ml of toluene and polymerized at 80° C. 72 hours. After completion of the polymerization, a solution of 2-bromofluorene (10 eq) in 10 ml of toluene was added to the reaction mixture. The reaction was maintained for 24 hours to ensure termination of produced polymers. After completion of the reaction, the reaction mixture was poured into 300 ml of a mixture of HCl, acetone and methanol (1:1:1) to remove un-reacted catalysts and precipitate the produced polymer. The polymer was filtered and dissolved in chloroform. The solution was again filtered through Celite to remove any remaining catalysts. The filtrate was concentrated and added to methanol. The resulting precipitate was washed on a Soxlet extraction apparatus for 24 hours. The product was obtained at 95% yield (Molecular weight Mn=3,100, Mw=5,700).

EXAMPLE 9

Synthesis of poly[9,9'-dioctyl-2,7-fluorenyl-co-6,6'-N,N'-di(3-methylphenyl)-3,3'-bicarbazyl] (1:1 feed ratio)

As a monomer solution, 0.250 g (0.455 mmol) of 9,9'-dioctyl-2,7-dibromofluorene and 0.348 g (0.455 mmol) of N,N'-di(3-methylphenyl)-6,6'-iodo-3,3'-bicarbazyl were added to 5 ml of toluene, which had been degassed with nitrogen atmosphere, in a 50 ml Schlenk flask and stored under nitrogen. As catalysts, 0.44 g (1.7 eq) of Ni(COD)$_2$, 0.17 g (1.7 eq) of 1,4-cyclooctadiene(COD) and 0.25 g (1.7 eq) of bipyridyl were added to another 50 ml Schlenk flask. Then, 5 ml of toluene, which had been degassed with nitrogen, and 5 ml of DMF were added thereto, followed by stirring at 80° C. for 30 minutes. The above-prepared monomer solution was added to the reactor after washing with 5 ml of toluene and polymerized at 80° C. for 72 hours. After completion of the polymerization, a solution of 2-bromofluorene (10 eq) in 10 ml of toluene was added to the reaction mixture. The reaction was maintained for 24 hours to ensure termination of produced polymers. After completion of the reaction, the reaction mixture was poured into 300 ml of a mixture of HCl, acetone and methanol (1:1:1) to remove un-reacted catalysts and precipitate the produced polymer. The polymer was filtered and dissolved in chloroform. The solution was again filtered through Celite to remove any remaining catalysts. The filtrate was concentrated and added to methanol. The resulting precipitate was washed on a Soxlet extraction apparatus for 24 hours: yield 65%; Molecular weight Mn=8,000, Mw=11,000.

EXAMPLE 10

Assessment of Optical Properties

Figure 6:
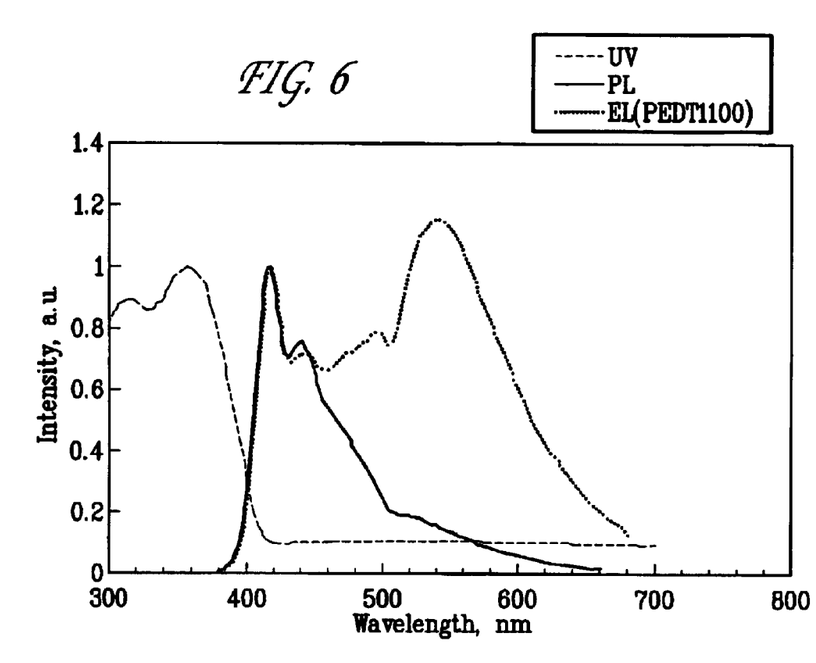
FIG. 6 is a view showing a UV-Vis spectrum, a photoluminescence spectrum, and an electroluminescence spectrum of the white electroluminescent polymer prepared in Example 8 as claimed in the present invention.
Figure 7:
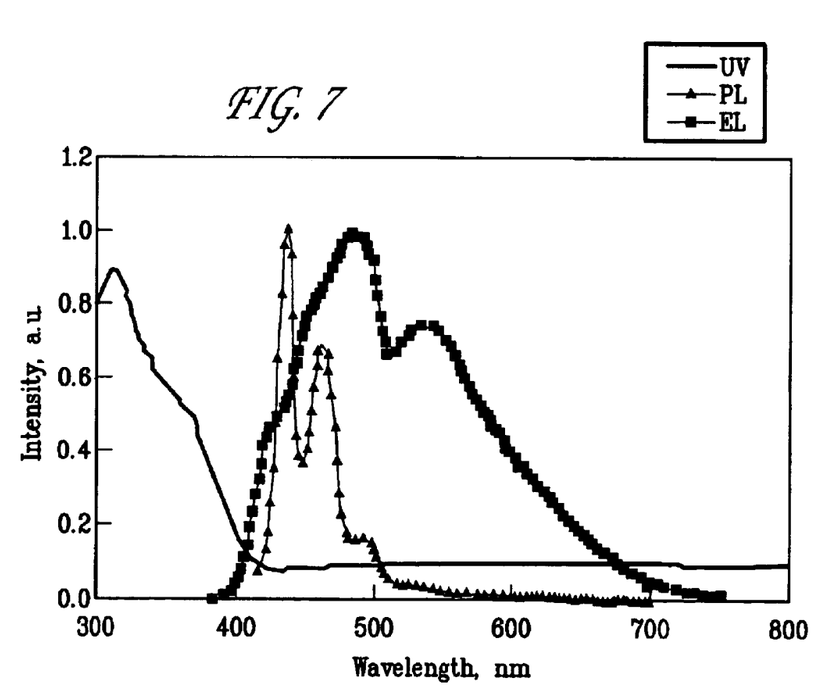
FIG. 7 is a view showing a UV-Vis spectrum, a photoluminescence spectrum, and an electroluminescence spectrum of the white electroluminescent polymer prepared in Example 9 as claimed in the present invention.

The polymers prepared in Examples 8 and 9 were dissolved in chlorobenzene. The resulting solutions were spin coated on quartz substrates to form thin films of the respective polymers. The thin films were measured for their UV absorption peaks and photoluminescence(PL) spectrums. As shown in FIG. 6, the polymer of Example 8 showed a maximum UV absorption peak at 357 nm and a maximum PL peak at 416 nm in an excitation wavelength of 357 nm. As shown in FIG. 7, the polymer of Example 9 showed a maximum UV absorption peak at 312 nm and a maximum PL peak at 436 nm in an excited wavelength of 312 nm.

EXAMPLE 11

Preparation of Electroluminescent Devices

Figure 8:
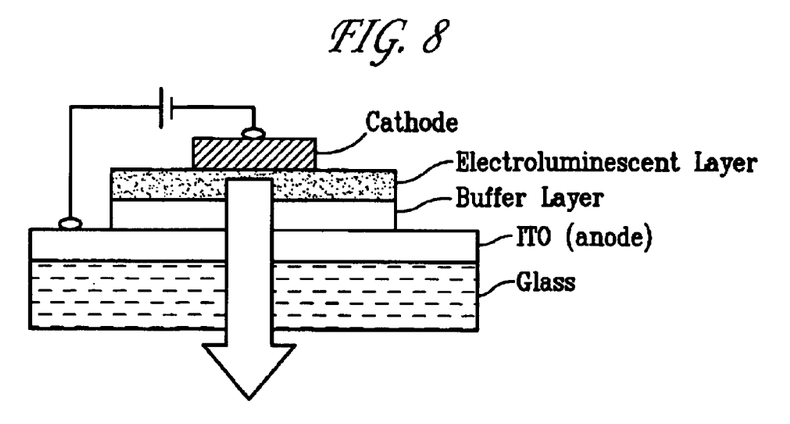
FIG. 8 shows a cross sectional view of an electroluminescent device prepared in Example 11 as claimed in the present invention.
Figure 9:
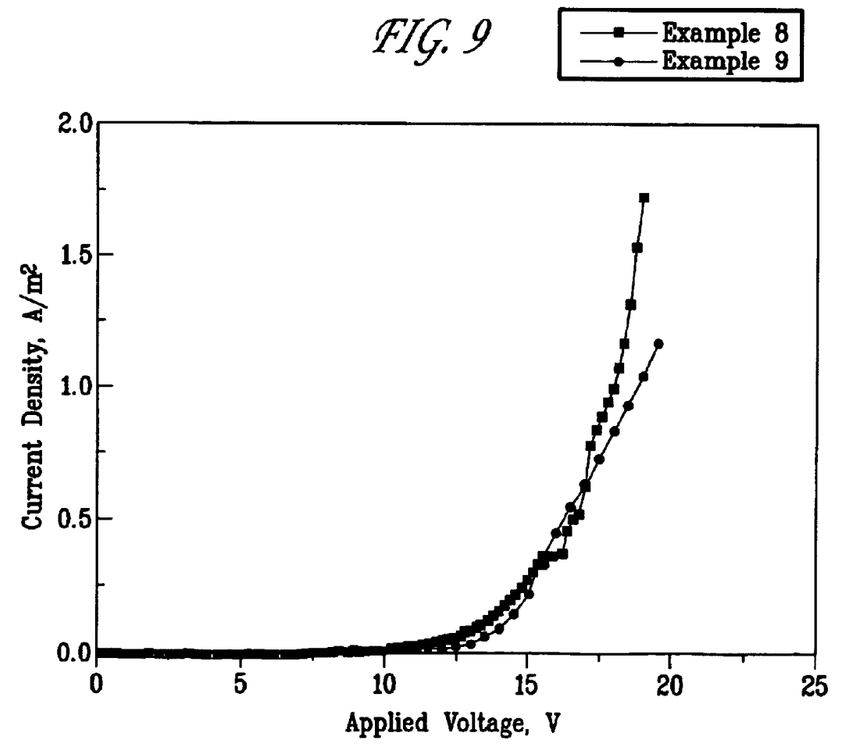
FIG. 9 is a view showing current density-voltage curves measured using an electroluminescent device prepared in Example 11 as claimed in the present invention.

Electroluminescent devices were prepared using the luminescent polymers prepared in Examples 8 and 9. Indium-tin oxide (ITO) was coated over two glass substrates. The transparent electrode substrates with ITO layer formed thereon were cleaned thoroughly and the ITO films were patterned using photoresist resin and etchant and cleaned again. Over the patterned ITO layers, Batron P 4083 produced by Bayer, was coated to a thickness of about 500 to 1100 Å and baked at 80° C. for 1 hour to form electrically conductive buffer layers. Each polymer from Examples 8 and 9 was dissolved in chlorobenzene or toluene to form organic electroluminescent polymer solutions. Each solution was filtered with a 0.2 μm filter and coated over the buffer layer by spin coating and the coated material then was baked. The laminates were then stored in a vacuum oven to completely remove the solvent to form thin films of the respective polymers. The thickness of the polymer films could be controlled by adjusting the concentration of the solution of the polymers and spinning speed. The resulting films of the polymers had a thickness of about 50 to 100 nm. Then, cathode metal was formed with Ca. An Al electrode was deposited using a vacuum depositing apparatus under a vacuum condition of $4 \times 10^{-6}$ torr or less over the Ca layer. The thickness and growing rate of the deposited film was controlled using a crystal sensor. The luminescent area was 4 mm$^2$ and the drive voltage was a forward bias voltage. The structures of the completed electroluminescent devices are shown in FIG. 8.

EXAMPLE 12

Characterization of the Electroluminescent Devices

Figure 10:
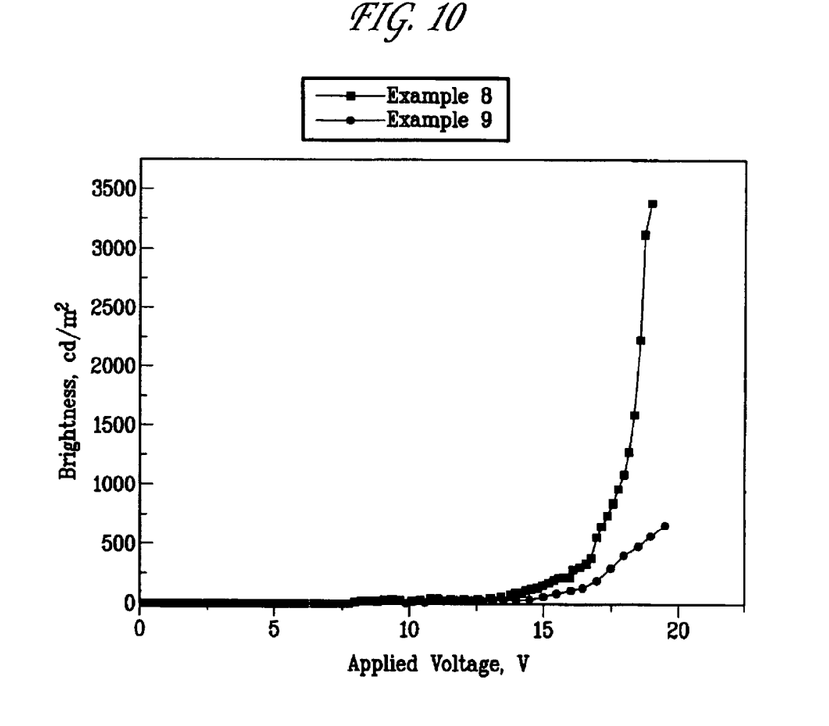
FIG. 10 is a view showing brightness-voltage curves measured using an electroluminescent device prepared in Example 11 as claimed in the present invention.

The electroluminescent devices prepared in Example 11 were measured for their electroluminescent properties. The results are shown in FIGS. 9 to 12. The single layered-type devices having the structure of ITO/PEDOT/polymer/Ca/Al, showed characteristics of typical rectifying diodes. The electroluminescent device including the polymer from Example 8 began to emit light at a turn-on voltage of about 9.0 V (FIG. 9) and had a maximum brightness of 3250 cd/m$^2$ (FIG. 10). The maximum luminescent efficiency of the device was 0.06 cd/A.

Figure 11:
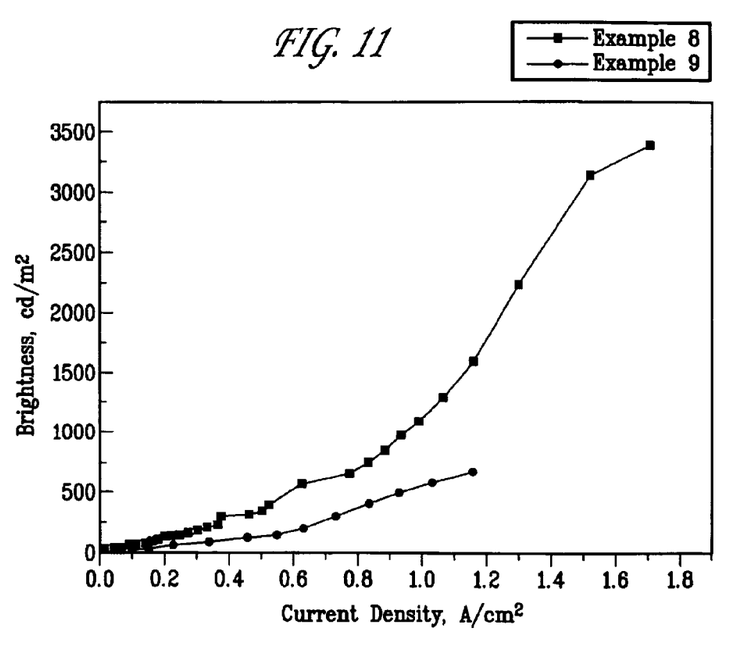
FIG. 11 is a view showing current density-voltage curves measured using an electroluminescent device prepared in Example 11 as claimed in the present invention.
Figure 12:
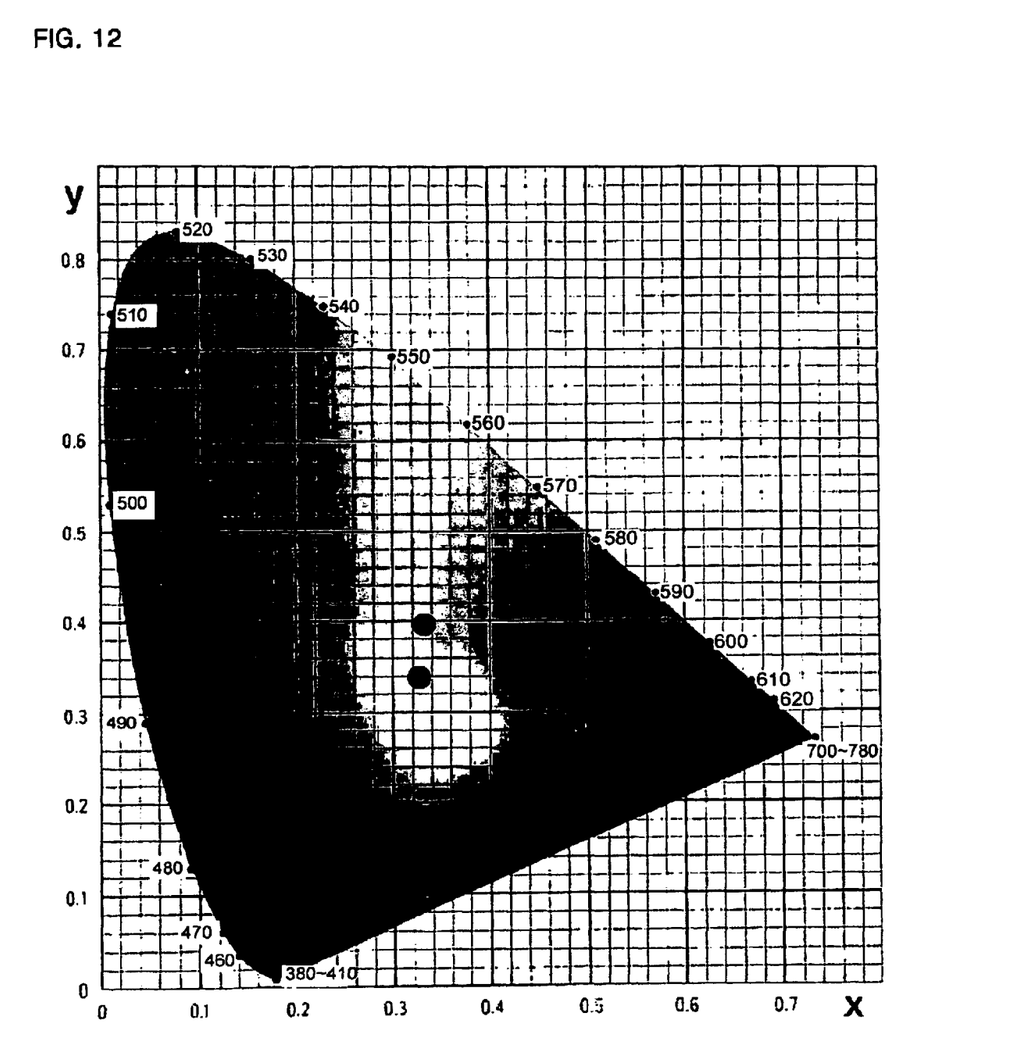
FIG. 12 is CIE 1931 color coordinates of an electroluminescent device prepared in Example 11 as claimed in the present invention.

In FIG. 11, current density-voltage curves of the electroluminescent devices prepared in Example 11 are shown. In FIG. 12, CIE 1931 color coordinates of the electroluminescent devices prepared in Example 11 are shown. The device made of the polymer from Example 8 had a coordinate of (0.321, 0.338) at 1000 cd/m$^2$ and the device of polymer from Example 9 had a coordinate of (0.331, 0.399) at 650 cd/m$^2$. Also, from the electroluminescence spectra shown in FIGS. 6 and 7, it was found that the devices prepared using the polymers of Examples 8 and 9 as claimed in the present invention could emit light across the entire visible region of 380 to 700 nm. That is, the device could emit white light. The devices were found to be stable enough to retain the initial voltage-current density property after being driven several times.

As discussed above, as claimed in the present invention, it is possible to solve the problems associated with the deterioration of the device performance such as color purity and durability due to phase separation occurring in the conventional electroluminescent polymer system by synthesizing a novel white electroluminescent polymer in which a 3,3'-bicarbazyl group having substituents at the N and N' positions is incorporated into a single polymeric main chain of polyarylene. Also, white electroluminescent devices with a high color purity can be provided.

While there have been illustrated and described what are considered to be preferred specific embodiments of the present invention, it will be understood by those skilled in the art that the present invention is not limited to the specific embodiments thereof, and various changes and modifications and equivalents may be substituted for elements thereof without departing from the true scope of the present invention.

What is claimed is:

1. A white electroluminescent polymer having a 3,3'-bicarbazyl group incorporated into a polymeric main chain of polyarylene, represented by the following Formula 1:

Formula 1 in which Ar is an aromatic group having 6 to 26 carbon atoms, or a heteroaromatic group, and if a heteroaromatic group Ar has 4 to 14 carbon atoms and one or more heteroatoms in the aromatic ring, in which the aromatic group may be substituted with at least one substituent selected from the group consisting of alkyl group, alkoxy group, and amine group, each having 1 to 12 carbon atoms, R is selected from the group consisting of a hydrogen atom, a linear, branched or cyclic alkyl group having 1 to 12 carbon atoms, and an aromatic up having 6 to 14 carbon atoms, in which the aromatic group may be substituted with at least one substituent selected from the group consisting of an alkyl group, an alkoxy group, and an amine group, each having 1 to 12 carbon atoms; and in and n may be the same or different, and satisfy the following relationships m+n=1.0, m/(m+n) is from 0.1 to 0.9, inclusive, and n/(m+n) is from 0.1 to 0.9, inclusive.

2. The white electroluminescent polymer as claimed in claim 1, wherein the Ar group is one or more groups selected from the group consisting of structures represented by the following Formula 2 and 3:

Formula 2 in which $R_1$ and $R_2$ are independently an alkyl or an alkoxy group having 1 to 12 carbon atoms, Formula 3 in which $R_1$ and $R_2$ are independently an alkyl group having 1 to 12 carbon atoms.

3. The white electroluminescent polymer as claimed in claim 2, wherein the Ar group is alkylfluorene.

4. The white electroluminescent polymer claimed in claim 1, wherein the white electroluminescent polymer has a weight average molecular weight (Mw) of from about 3,000 to about 200,000 and the molecular weight distribution (Mw/Mn) is from about 1.5 to about 5.

5. An organic electroluminescent device comprising an electroluminescent layer comprising the white electroluminescent polymer as claimed in claim 1.

6. The organic electroluminescent device as claimed in claim 5, wherein the device has a structure selected from the group consisting of anode/hole transporting layer/luminescent layer/cathode, anode/buffer layer/hole transporting layer/luminescent layer/cathode, anode/buffer layer/hole transporting layer/luminescent layer/electron transporting layer/cathode, and anode/buffer layer/hole transporting layer/luminescent layer/hole blocking layer/cathode.

7. The organic electroluminescent device as claimed in claim 6, wherein the buffer layer comprises at least one material selected from the group consisting of polythiophene, polyaniline, polyacetylene, polypyrrole or polyphenylene vinylene derivatives.

8. The organic electroluminescent device a claimed in claim 6, wherein the hole blocking layer is comprised of LiF or $MgF_2$.

* * * * *